United States Patent
Chen et al.

(10) Patent No.: US 12,022,598 B2
(45) Date of Patent: Jun. 25, 2024

(54) DETECTION AND CHARGE NEUTRALIZATION DEVICE AND METHOD THEREOF

(71) Applicant: Taiwan Electron Microscope Instrument Corporation, Hsinchu (TW)

(72) Inventors: Hsu-Wei Chen, Hsinchu (TW); Hsin-Chi Cheng, Hsinchu (TW); Tsu-Wei Huang, Hsinchu (TW); Ting-Yu Hsieh, Hsinchu (TW)

(73) Assignee: TAIWAN ELECTRON MICROSCOPE INSTRUMENT CORPORATION, Hsinchu (TW)

( * ) Notice: Subject to any disclaimer, the term of this patent is extended or adjusted under 35 U.S.C. 154(b) by 54 days.

(21) Appl. No.: 17/855,333

(22) Filed: Jun. 30, 2022

(65) Prior Publication Data
US 2023/0007762 A1    Jan. 5, 2023

(30) Foreign Application Priority Data

Jul. 2, 2021    (TW) ................... 110124378

(51) Int. Cl.
*H05F 3/06*    (2006.01)
*G01R 29/12*    (2006.01)

(52) U.S. Cl.
CPC ............ *H05F 3/06* (2013.01); *G01R 29/12* (2013.01)

(58) Field of Classification Search
CPC .. H05F 3/06; H05F 3/00; G01R 29/12; G01R 19/0061; G01R 29/24
USPC ........................................ 361/213
See application file for complete search history.

(56) References Cited

U.S. PATENT DOCUMENTS

| | | | |
|---|---|---|---|
| 10,569,449 B1 * | 2/2020 | Curts | B29C 43/003 |
| 2003/0003241 A1 * | 1/2003 | Suzuki | B05D 1/12 |
| | | | 427/595 |
| 2005/0174584 A1 * | 8/2005 | Chalmers | G03F 7/70483 |
| | | | 356/630 |
| 2011/0068265 A1 * | 3/2011 | Arai | H01J 37/28 |
| | | | 250/306 |

(Continued)

FOREIGN PATENT DOCUMENTS

| | | |
|---|---|---|
| CN | 101241026 A | 8/2008 |
| CN | 106645236 A | 5/2017 |

(Continued)

OTHER PUBLICATIONS

Ataka M; Electric charge type antistatic decontaminate device scan electron microscope distribute unit extract ion plasma discharge vicinity measure sample; Publication Date: Jun. 14, 2007, Entire specification, drawings (Year: 2007).*

*Primary Examiner* — Dharti H Patel
(74) *Attorney, Agent, or Firm* — MUNCY, GEISSLER, OLDS & LOWE, P.C.

(57) ABSTRACT

A detection and charge neutralization device comprises a vacuum chamber, an electrical optical system, and a charge neutralization member. The electrical optical system and the charge neutralization member are disposed inside the vacuum chamber. The electrical optical system, outputs a charged particle beam to an observation position of the vacuum chamber. The charge neutralization member provides a focused vacuum ultraviolet light to the observation position to neutralize the accumulating charges.

13 Claims, 6 Drawing Sheets

(56) References Cited

U.S. PATENT DOCUMENTS

| | | | |
|---|---|---|---|
| 2011/0204228 A1 | 8/2011 | Tsuno et al. | |
| 2012/0099089 A1* | 4/2012 | Sogard | G03F 1/84 355/77 |
| 2022/0299882 A1* | 9/2022 | Huang | G03F 7/70033 |

FOREIGN PATENT DOCUMENTS

| | | | | |
|---|---|---|---|---|
| CN | 114690536 A | * | 7/2022 | G03F 1/82 |
| CN | 115524938 A | * | 12/2022 | G03F 7/70033 |
| JP | H01-194256 A | | 8/1989 | |
| JP | 2000-036273 A | | 2/2000 | |
| JP | 2002-231172 A | | 8/2002 | |
| JP | 2005-174591 A | | 6/2005 | |
| JP | 2006-344444 A | | 12/2006 | |
| JP | 2006-351303 A | | 12/2006 | |
| JP | 2007-026987 A | | 2/2007 | |
| JP | 2007-113992 A | | 5/2007 | |
| JP | 2009-004114 A | | 1/2009 | |
| TW | I484522 | | 5/2015 | |
| TW | 201618151 A | | 5/2016 | |
| TW | 201841182 A | | 11/2018 | |
| WO | WO-2004/109742 A2 | | 12/2004 | |
| WO | WO-2013118594 A1 | * | 8/2013 | H01J 37/026 |

\* cited by examiner

DETECTION AND CHARGE NEUTRALIZATION DEVICE AND METHOD THEREOF

CROSS REFERENCES

This application claims benefit of Taiwan Patent Application No. 110124378 filed on Jul. 2, 2021, the disclosure of which is hereby incorporated by references.

1. FIELD OF THE INVENTION

The present invention relates to a charge neutralization technology, particularly to a detection and charge neutralization device and a method thereof.

2. DESCRIPTION OF THE PRIOR ART

In a display panel factory, while a protection film is to be peeled off from a panel, ultraviolet light is projected onto the panel to remove the electrostatic charges generated by peeling off the protection film lest the electrostatic charges damage the panel.

A Taiwan patent No. 1484522 disclosed a charged particle radiation device, which is a charge remover for an electrostatic chuck, wherein an ultraviolet light device and ultraviolet light-illuminated components are arranged in a direction vertical to the sucking surface of the electrostatic chuck to remove the charges of the electrostatic chuck.

SUMMARY OF THE INVENTION

The present invention provides a detection and charge neutralization device, which performs detection and charge neutralization, wherein focused vacuum ultraviolet light is used to continuously neutralize the charges accumulating on the sample while a charged particle beam undertakes a scanning-type detection process.

The present invention provides a detection and charge neutralization device, which performs detection and charge neutralization, wherein focused vacuum ultraviolet light is projected to an area where a charged particle beam reacts with the sample, whereby to continuously eliminate the accumulating charges.

In order to achieve the abovementioned objectives, the present invention proposes a detection and charge neutralization device, which comprises a vacuum chamber; an electrical optical system, which outputs a charged particle beam to an observation position in the vacuum chamber; and a charge neutralization member, which provides a focused vacuum ultraviolet light to the observation position, wherein the charge neutralization member includes a light output surface that emits a vacuum ultraviolet light and a light focusing member that focuses the vacuum ultraviolet light to form a focused vacuum ultraviolet light.

In one embodiment, the wavelength of the vacuum ultraviolet light ranges from 10 nm to 300 nm, preferably from 100 nm to 200 nm.

In one embodiment, the light focusing member is disposed near the light output surface or attached to the light output surface to receive and focus the vacuum ultraviolet light.

In one embodiment, the detection and charge neutralization device of the present invention further includes an adjustment member, which is used to adjust the position, the orientation, or a combination thereof of a planar reflector.

In one embodiment, the light focusing member includes a concave mirror, which is disposed near the light output surface to receive, focus, and reflect the vacuum ultraviolet light, wherein the concave mirror is rotatable.

In one embodiment, the light focusing member includes a collimator and a focusing lens both arranged inside a tube, wherein the collimator is disposed near the light output surface or attached to the light output surface.

In one embodiment, the light focusing member includes an optical fiber, or a light guide, or a focusing lens integrated with an optical fiber, or a focusing lens integrated with a light guide.

In one embodiment, the focused vacuum ultraviolet light is projected to the observation position in a direct not parallel to the direction of the charged particle beam.

In one embodiment, the radius of the projection area of the focused vacuum ultraviolet light on the observation position ranges from 0.005 mm to 50 mm, preferably smaller than 10 mm, more preferably smaller than 5 mm.

In one embodiment, the detection and charge neutralization device of the present invention includes a plurality of charge neutralization members.

Based on the abovementioned structure, the present invention also proposes a detection and charge neutralization method, which comprises steps: moving a sample to an observation position of a vacuum chamber; providing a charged particle beam to the observation position to let the charged particle beam react with the sample and generate signals; and providing a focused vacuum ultraviolet light to the observation position to neutralize charges on the sample.

In one embodiment, the detection and charge neutralization method further includes a step: after the focused vacuum ultraviolet light has been projected to the observation position for a given interval of time, turning off the focused vacuum ultraviolet light or hindering the focused vacuum ultraviolet light from being projected to the observation position via blocking the focused vacuum ultraviolet light.

In one embodiment, the detection and charge neutralization method further includes a step: alternately or simultaneously providing the charged particle beam and the focused vacuum ultraviolet light.

In one embodiment, the wavelength of the focused vacuum ultraviolet light ranges from 100 nm to 200 nm.

In one embodiment, the step of providing the focused vacuum ultraviolet light includes providing a plurality of the focused vacuum ultraviolet lights to the observation position.

DESCRIPTION OF THE PREFERRED EMBODIMENT

The charge neutralization device of the present invention is applicable to electronic instrument, ionic instruments and microscope. The electronic instrument may be but is not limited to be an Auger Electron Microscope, an X-ray Photoelectron Spectrometer (XPS), an Angle Resolved Ultraviolet Photoelectron Spectrometer (ARUPS), or a High Resolution Electron Energy Loss Spectrometer (HREELS). The ionic instrument may be but is not limited to be an Ion Scattering Spectrometer (ISS), a Secondary Ion Mass Spectrometer (SIMS), or a Focused Ion Beam Microanalyzer. The microscope may be but is not limited to be a Scanning Electron Microscope (SEM), a Transmission Electron Microscope (TEM), a Scanning Transmission Electron Microscope (STEM), or a Field Ion Microscope (FIM). The interaction of the sample and the charged particle beam, which is generated by the abovementioned electronic instrument, ionic instrument or microscope, may generate signals, such as secondary electrons, backscattered electrons, Auger electrons, scattered ions, or characteristic X-ray. The signals carry the information about the material or structure of the detected sample. The charged particle beam detection systems mentioned thereinafter include the abovementioned electronic instrument, ionic instrument and microscope. It should be understood: the structures and fundamental elements of these devices belong to the prior art, and the description of this specification will not repeat the prior art but will focus on characteristics of the present invention.

The materials to be detected by the abovementioned instruments may be different from each other. The material is sampled as the sample, and the sample is moved to the detection device for inspection. The material of a sample may be but is not to be selected from a group including quartz, glass, ceramic materials, polymeric materials, metal oxides, oxide semiconductors, metal nitrides, nitride semiconductors, semiconductor materials and glues. It should be understood: considering the detection principles and processes, some kinds of samples should be surface-treated before they are moved to the detection devices to function as samples. Naturally, surface treatment would increase the cost of detection.

The wavelength of the vacuum ultraviolet light mentioned in the present invention ranges from 10 nm to 300 nm, including the ranges of short wavelength ultraviolet light (Ultraviolet-C, UVC) and vacuum ultraviolet (VUV) light.

Figure 1:
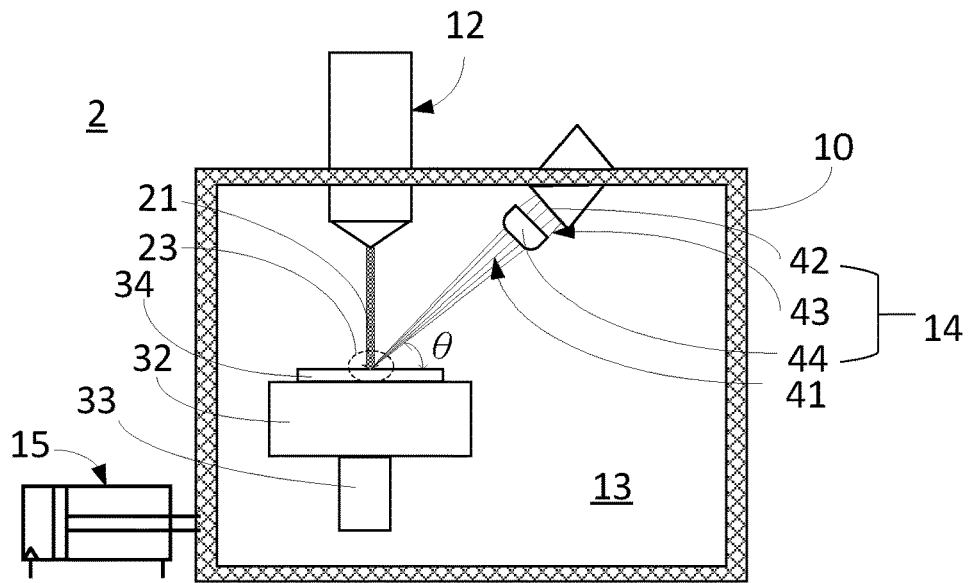
FIG. 1 is a side view schematically showing a detection and charge neutralization device for a charged particle beam detection system according to a first embodiment of the present invention.

Refer to FIG. 1. FIG. 1 is a side view schematically showing a detection and charge neutralization device for a charged particle beam detection system according to a first embodiment of the present invention. The detection and charge neutralization device 2 of the present invention comprises a chamber 10, an electrical optical system 12, and a charge neutralization member 14. In one embodiment, the chamber 10 provides a space to function as a vacuum chamber 13 of the charged particle beam detection system. For example, the space provided by the chamber 10 is evacuated by a vacuum pump 15 to function as the vacuum chamber 13. The electrical optical system 12 outputs a charged particle beam 21, including a charge generation source, corresponding optical members and imaging members. The electrical optical system 12 may be fixed onto the chamber 10 or partly/completely disposed inside the vacuum chamber 13. The charge generation source emits a charged particle beam to pass through corresponding optical members and enter the vacuum chamber 13. The detection and charge neutralization device 2 may further includes a carrier member 32. A sample 34 is placed on the carrier member 32 and moved to an observation position 23 by the carrier member 32. The detection and charge neutralization device 2 may further comprises an adjustment seat 33. The adjustment seat 33 is connected with the carrier member 32, adjusting and changing the position, tilting angle and orientation of the carrier member 32 via horizontal movement, vertical movement, tilting, and rotation. Thus, the position, tilting angle and orientation of the sample 34 may be changed by changing the position, tilting angle and orientation of the carrier member 32. The charged particle beam 21 of the electrical optical system 12 enters the vacuum chamber 13 and then reaches the observation position 23, reacting with the sample 34 at the observation position 23 to generate signals carrying the information about the sample 34. The electrical optical system 12 captures the signals and acquires the images or information about the sample. The material of the sample 34 may be but is not to be selected from a group including quartz, glass, ceramic materials, polymeric materials, metal oxides, oxide semiconductors, metal nitrides, nitride semiconductors, semiconductor materials, glues and combinations one or more thereof. The information about the sample includes the material of the sample, the surface structure of the sample, or the combination thereof.

Refer to FIG. 1 again. The observation position 23 includes the reaction area where the charged particle beam 21 reacts with the sample 34, wherein the reaction area may be the surface of the sample 34 or the area under the surface of the sample 34. It should be explained: while the charged particle beam 21 detects the sample 34, charges continuously generate and accumulate on the surface of the sample 34. During the detection process, the charges accumulating on the surface of the sample 34 will influence the imaging of the signals. In the conventional technology, a surface treatment, is performed on the detected sample to decrease charge accumulation; for example, a conductive film is electroplated on the surface of the detected sample. However, the present invention is to neutralize charges continuously during the detection process to prevent from charge accumulation. Via the cooperation of the charge neutralization member 14 and the vacuum chamber 13, the present invention projects a focused vacuum ultraviolet light 41 to the observation position 23 to continuously perform neutralization on the observation position 23. Alternatively, which minor amount of gas is dissociated into positive ions and negative ions to neutralize the accumulating charges may be adopted in the present invention. Alternatively, the focused vacuum ultraviolet light 41 is projected onto the surface of the sample 34 to induce the photoelectric effect and generate charges, whereby to neutralize the accumulating charges. In one embodiment, the charge neutralization member 14 includes a light output surface 42 that outputs a vacuum ultraviolet light 43 and a light focusing member 44 disposed on the light output surface 42. The light focusing member 44 focuses the vacuum ultraviolet light 43 emitted by the light output surface 42, whereby to increase the luminous flux per unit area on the observation position 23. The light output surface 42 may be sourced from the commercially-available vacuum ultraviolet instruments. The vacuum ultraviolet light emitted by the commercially-available vacuum ultraviolet instruments is normally a collimated light beam or a slightly-scattered light beam. The light focusing member 44, such as a convex lens, is disposed on the chamber 10 or inside the vacuum chamber 13, focusing the vacuum ultraviolet light 43 to output the focused vacuum ultraviolet light 41 to the observation position 23 or the perimeter thereof, whereby the focused vacuum ultraviolet light 41 is focused on the observation position 23 in a high luminous flux per unit area to generate positive charges for neutralizing the charges accumulating in the nearby of the sample 34. For example, the light focusing member 44 emits the focused vacuum ultraviolet light 41 onto an area of the surface of the sample 34, whose diameter ranges from 0.005 mm to 50 mm, preferably smaller than 10 mm, such as 5 mm, whereby the intensified luminous flux can generate positive charges or negative charges to neutralize the non-signal charges at the observation position 23. However, the present invention is not limited by the abovementioned example. Besides, the adjustment seat 33 may be used to adjust the positon, tilting angle or orientation of the sample 34. The adjustment seat 33 may cooperate with the angle, position and range of the focused vacuum ultraviolet light 41 to prevent from light blocking caused by the other components of the vacuum chamber 13 or the structures of the sample 34, whereby to enhance the charge-neutralization or charge-reducing effect.

Refer to FIG. 1 again. The electrical optical system 12 is normally exactly above the observation position 23. Therefore, the focused vacuum ultraviolet light 41 output by the charge neutralization member 14 reaches the observation position 23 at a tilting angle θ (the included angle of the focused vacuum ultraviolet light 41 and the surface of the carrier member 32). The focused vacuum ultraviolet light 41 is not parallel to the charged particle beam 21. The angle θ between the focused vacuum ultraviolet light 41 and the sample 34 is smaller than 180 degrees. Furthermore, there is a convergence angle when the focus ultraviolent light 41 travels from the light focusing member 44 to the observation position 23.

Figure 2:
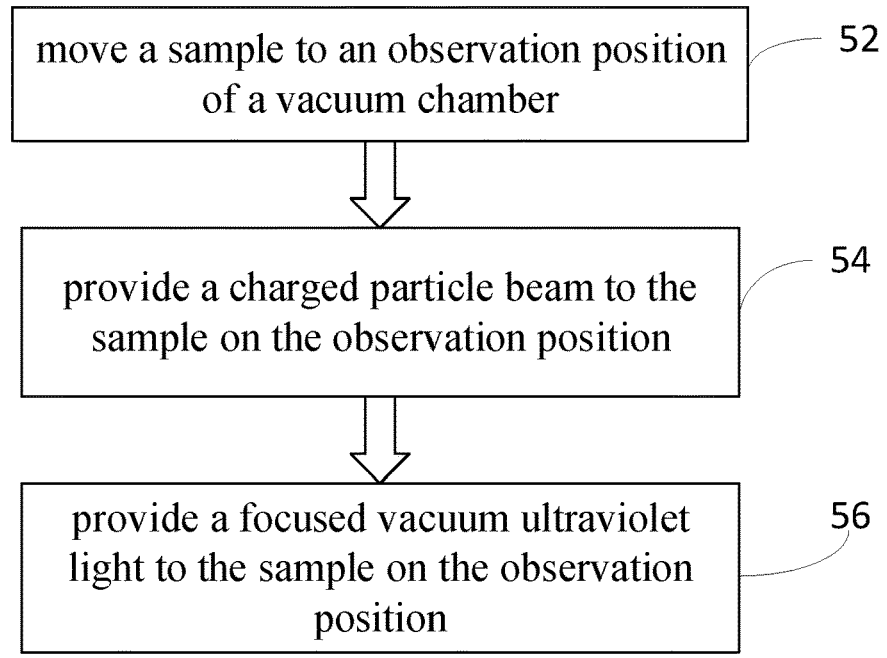
FIG. 2 is a flowchart of a method of using the detection and charge neutralization device of the first embodiment to perform a detection and charge neutralization process.

Based on the structure described above, the present invention provides a method of using a detection and charge neutralization device to perform detection and charge neutralization process. Refer to FIG. 2. In Step S52, move a sample into a vacuum chamber of the detection and charge neutralization device, adjust the sample to an observation position. For a charged particle beam detection system, the observation position is normally exactly under the charge generation source of the charged particle beam detection system. However, the present invention is not limited by the example. In Step S54, project a charged particle beam to the sample on the observation position to make the charged particle beam react with the sample. In Step S56, project a focused vacuum ultraviolet light to the sample on the observation position persistently for a given interval of time to neutralize the non-signal accumulating charges. After the focused vacuum ultraviolet light is turned off or blocked, let the charged particle beam react with the sample to generate signals carrying the information about the sample for imaging. It is an option: in the equipment where the interference in capturing the signals of the information about the sample is less likely to occur, the action of projecting the focused vacuum ultraviolet light and the action of using the charged particle beam to scan the sample may be performed simultaneously. In other words, the action of providing the focused vacuum ultraviolet light is not interrupted but performed persistently to neutralize the non-signal charges.

Figure 3:
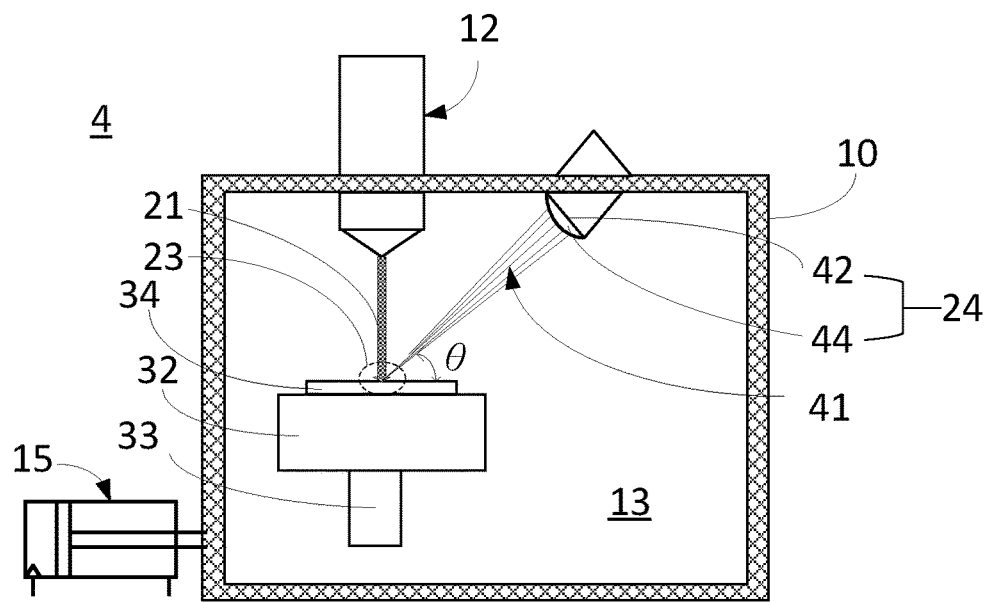
FIG. 3 is a side view schematically showing a detection and charge neutralization device for a charged particle beam detection system according to a second embodiment of the present invention.

Refer to FIG. 3. FIG. 3 is a side view schematically showing a detection and charge neutralization device for a charged particle beam detection system according to a second embodiment of the present invention. The second embodiment is different from the first embodiment in that the light focusing member 44 of the charge neutralization member 24 of the detection and charge neutralization device 4 is not separated from the light output surface 42 by a distance but directly attached to the light output surface 42. Therefore, in the second embodiment, the collimated vacuum ultraviolet light emitted by the light output surface 42 directly enters the light focusing member 44 and then is focused to be the focused vacuum ultraviolet light 41.

Figure 4:
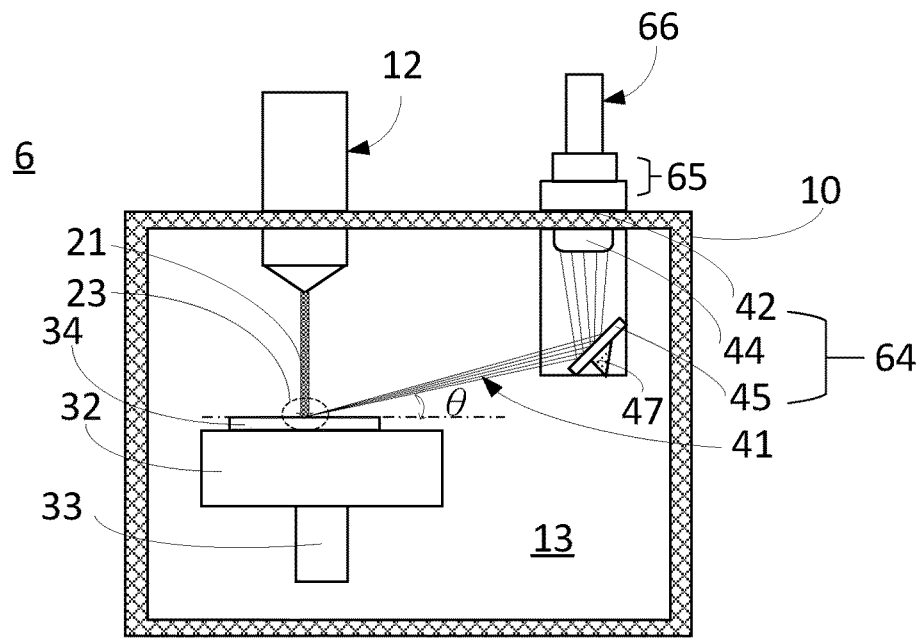
FIG. 4 is a side view schematically showing a detection and charge neutralization device for a charged particle beam detection system according to a third embodiment of the present invention.

FIG. 4 is a side view schematically showing a detection and charge neutralization device for a charged particle beam detection system according to a third embodiment of the present invention. Refer to FIG. 4. The charge neutralization member 64 of the detection and charge neutralization device 6 includes an optical module. The optical module may have a light focusing member 44 and a reflective member 45. In an ultraviolet light source device 66, the light output surface 42 is docked to the light focusing member 44 of the optical module. The vacuum ultraviolet light output by the light output surface 42 is focused by the light focusing member 44 and then reflected by the reflective member 45 to the observation position 23. The detection and charge neutralization device 6 further includes a sealing member 65 for securing the ultraviolet light source device 66 and enabling the docking of the ultraviolet light source device 66 with the optical module, whereby to guarantee the airtightness of the docking. In comparison with the first embodiment, the charge neutralization member 64 of the third embodiment additionally has the reflective member 45 able to change the optical path, whereby is increased the flexibility of installing the charge neutralization member 64 in the detection and charge neutralization device 6. It is an option: the charge neutralization member 64 further includes an adjustment member 47. The adjustment member 47 may be used to adjust the position, angle, or orientation of the reflective member 45, or perform a combination of adjustments of position, angle and orientation, whereby to vary the angle θ between the focused vacuum ultraviolet light 41 and the sample 34. In this embodiment, the light focusing member 44 may be a single convex lens or a lens group; the reflective member 45 may be a planar reflector; the adjustment member 47 may be a stage; the sealing member 65 may be a flange. Furthermore, there is a convergence angle when the focus ultraviolent light 41 travels from the adjustment member 47 to the observation position 23.

Figure 5:
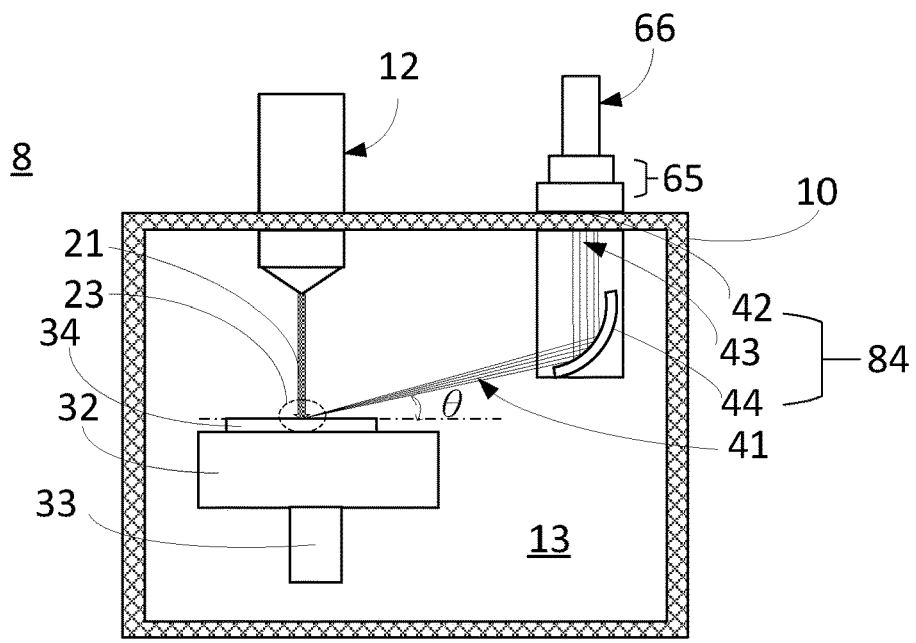
FIG. 5 is a side view schematically showing a detection and charge neutralization device for a charged particle beam detection system according to a fourth embodiment of the present invention.

FIG. 5 is a side view schematically showing a detection and charge neutralization device for a charged particle beam detection system according to a fourth embodiment of the present invention. Refer to FIG. 1, FIG. 4 and FIG. 5. In the fourth embodiment, the light focusing member 44 of the charge neutralization member 84 of the detection and charge neutralization device 8 is a concave mirror able to perform focusing reflection. Therefore, the collimated or slightly-scattered vacuum ultraviolet light 43, which comes from the light output surface 42, is focused and reflected by the light focusing member 44 to reach the observation position 23. The other elements of the fourth embodiment are the same as those of the abovementioned embodiments and will not repeat herein.

Figure 6:
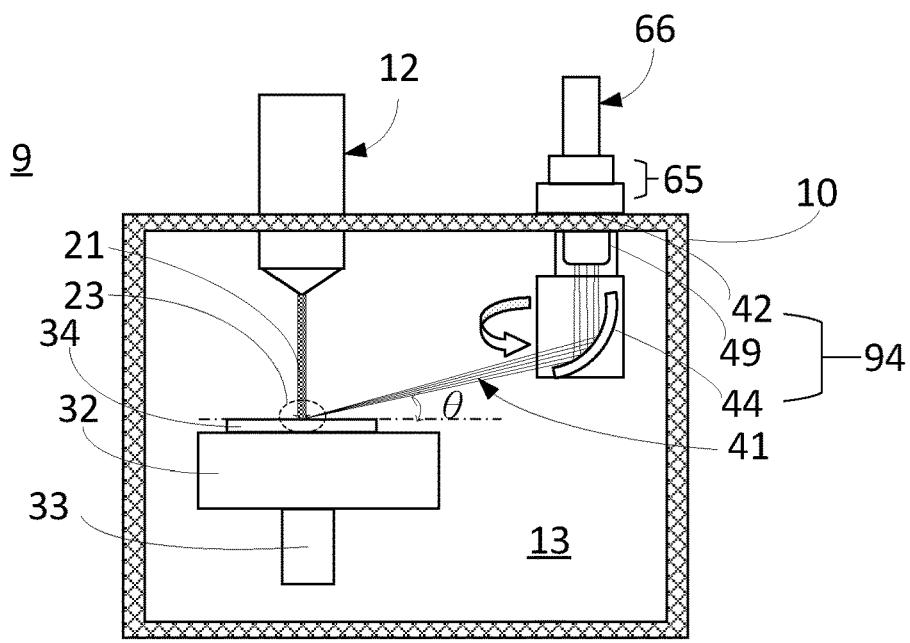
FIG. 6 is a side view schematically showing a detection and charge neutralization device for a charged particle beam detection system according to a fifth embodiment of the present invention.

FIG. 6 is a side view schematically showing a detection and charge neutralization device for a charged particle beam detection system according to a fifth embodiment of the present invention. Refer to FIG. 1, FIG. 4, FIG. 5 and FIG. 6. In the fifth embodiment, the charge neutralization member 94 of the detection and charge neutralization device 9 includes a light output surface 42, a collimator 49 and a light focusing member 44, wherein the light focusing member 44 is a focusing reflector. The collimator 49 and the light focusing member 44 are respectively disposed inside different tubes. In the fifth embodiment, the tube where the light focusing member 44 is disposed may be rotated independently, e.g. rotated +/−45 degrees, whereby the output focused vacuum ultraviolet light 41 can be focused to the observation position 23 more accurately. It is easily understood: the tilting angle of the tube where the light focusing member 44 is disposed may be adjusted. The other elements of the fifth embodiment are the same as those of the abovementioned embodiments and will not repeat herein.

Figure 7:
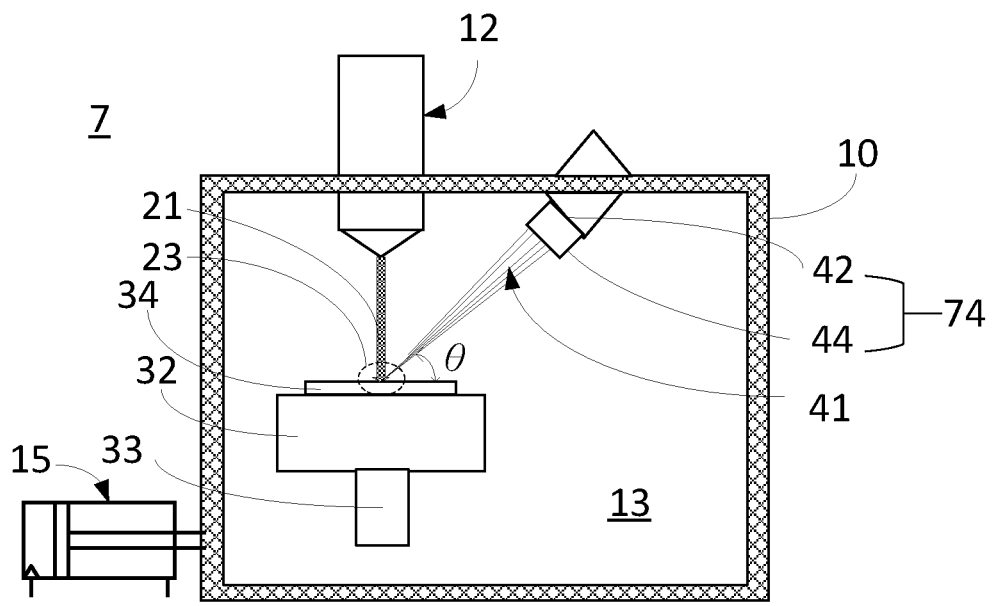
FIG. 7 is a side view schematically showing a detection and charge neutralization device for a charged particle beam detection system according to a sixth embodiment of the present invention.
Figure 8:
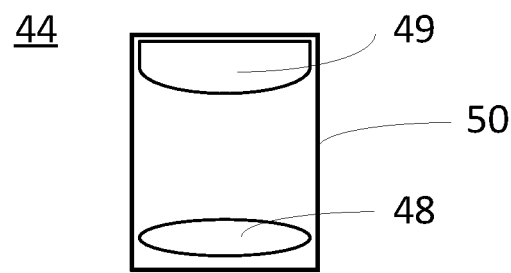
FIG. 8 is a magnified diagram schematically showing a charge neutralization member according to the sixth embodiment of the present invention.

FIG. 7 is a side view schematically showing a detection and charge neutralization device for a charged particle beam detection system according to a sixth embodiment of the present invention. FIG. 8 is a magnified diagram schematically showing a charge neutralization member according to the sixth embodiment of the present invention. Refer to FIG. 1, FIG. 7 and FIG. 8. In the sixth embodiment, the light focusing member 44 of the charge neutralization member 74 of the detection and charge neutralization device 7 includes a tube 50 wherein a collimator 49 and a focusing lens 48 are disposed inside the tube 50. The collimator 49 and the focusing lens 48 may be separately disposed inside the tube 50. Alternatively, the collimator 49 and the focusing lens 48 are closely disposed inside the tube 50. In the sixth embodiment, the charge neutralization member 74 converges the vacuum ultraviolet light 43 into the focused vacuum ultraviolet light 41 in a direct projection way, similarly to that in the first embodiment. Matched with the charged particle beam 21, the radius of the projection area of the focused vacuum ultraviolet light 41 ranges from 0.005 mm to 50 mm. The other elements of the sixth embodiment are the same as those of the abovementioned embodiments and will not repeat herein.

Figure 9:
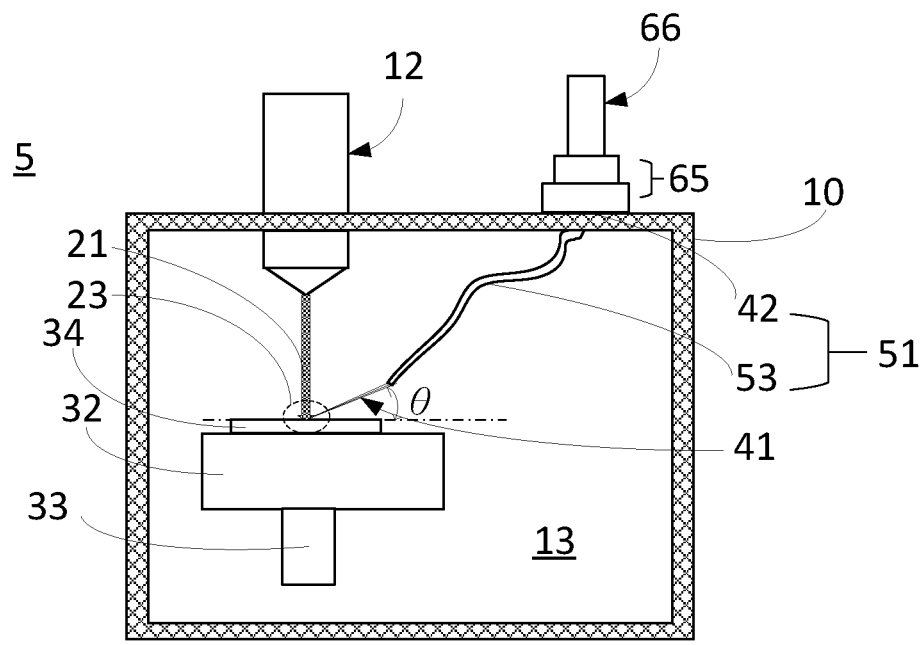
FIG. 9 is a side view schematically showing a detection and charge neutralization device for a charged particle beam detection system according to a seventh embodiment of the present invention.

FIG. 9 is a side view schematically showing a detection and charge neutralization device for a charged particle beam detection system according to a seventh embodiment of the present invention. Refer to FIG. 1 and FIG. 9. In the seventh embodiment, the charge neutralization member 51 of the detection and charge neutralization device 5 includes a light guide member 53, such as a fiber and a light guide. The light guide member 53 is coupled to the light output surface 42. The light output by the ultraviolet light source device 66 is conducted to the light guide member 53 and then transmitted to a location in the vacuum chamber 13, which is near the observation position 23, whereby is also achieved the target of the present invention: using the charge neutralization member 51 to perform focusing and form the focused vacuum ultraviolet light 41. Matched with the charged particle beam 21, the radius of the projection area of the focused vacuum ultraviolet light 41 ranges from 0.005 mm to 50 mm. It is an option: the light focusing lens may be built in the light guide member 53 or disposed between the light guide member 53 and the light output surface 42. The other elements of the seventh embodiment are the same as those of the abovementioned embodiments and will not repeat herein. Furthermore, there is a convergence angle when the focus ultraviolet light 41 travels from the light guide member 53 to the observation position 23. Thus, it is understood that the more convergent the focus ultraviolent light 41 is, the more the intensified luminous flux of the focus ultraviolent light 41 is. Accordingly, the radius of the projection area of the focused vacuum ultraviolet light 41 may be reduced to be smaller, such as from 0.0005 mm to 50 mm.

Figure 10:
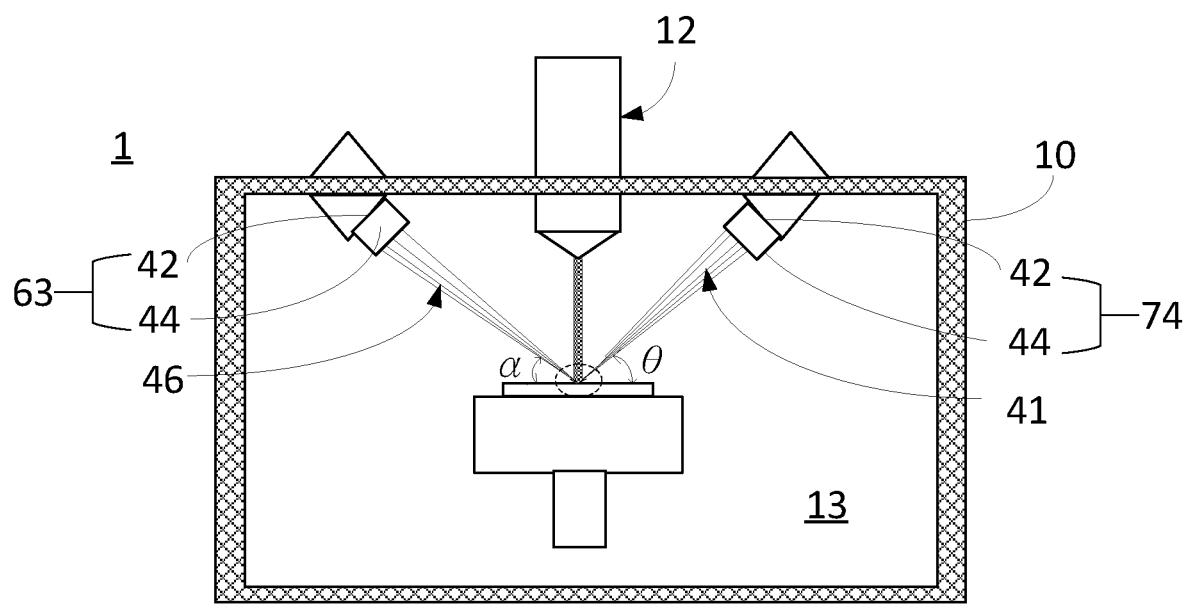
FIG. 10 is a side view schematically showing a detection and charge neutralization device for a charged particle beam detection system according to an eighth embodiment of the present invention.

FIG. 10 is a side view schematically showing a detection and charge neutralization device for a charged particle beam detection system according to an eighth embodiment of the present invention. Refer to FIG. 7 and FIG. 10. In comparison with the detection and charge neutralization device 7 in FIG. 7, the detection and charge neutralization device 1 of the eighth embodiment further includes a charge neutralization member 63. The charge neutralization member 63 provides an additional focused vacuum ultraviolet light 46. The focused vacuum ultraviolet light 46 is projected to the observation position at an angle α. In the eighth embodiment, the charge neutralization member 63 may be any one of the charge neutralization members disclosed in the first to seventh embodiments. In the process of detection and charge neutralization, the charge neutralization member 63 may provide irradiation, which is the same as or different from that provided by the charge neutralization member 74, considering the factors of geometrical shapes, surface materials, structures, etc. For example, the charge neutralization member 74 and the charge neutralization member 63 respectively provide the focused vacuum ultraviolet light 41 and the focused vacuum ultraviolet light 46, which separately have different frequency bands or have the same frequency bands; the focused vacuum ultraviolet lights 41 and 46 are respectively projected at angles θ and α, which are different or identical; the focused vacuum ultraviolet lights 41 and 46 are respectively projected to the same or different areas of the observation position; the projection areas of the focused vacuum ultraviolet lights 41 and 46 are different or identical; while collaborating with the charged particle beam during detection, the charge neutralization member 74 and the charge neutralization member 63 may be continuously or intermittently turned on or turned off/blocked in the same interval of time or in different intervals of time. Therefore, the cooperation of two charge neutralization members is adapted to a single sample having an uneven surface, a heterogeneous junction, or a non-uniform material distribution, overcoming the inefficient charge neutralization caused by light-blocking structure, discontinuous electric conductivity, and uneven charge accumulation speed.

Figure 11:
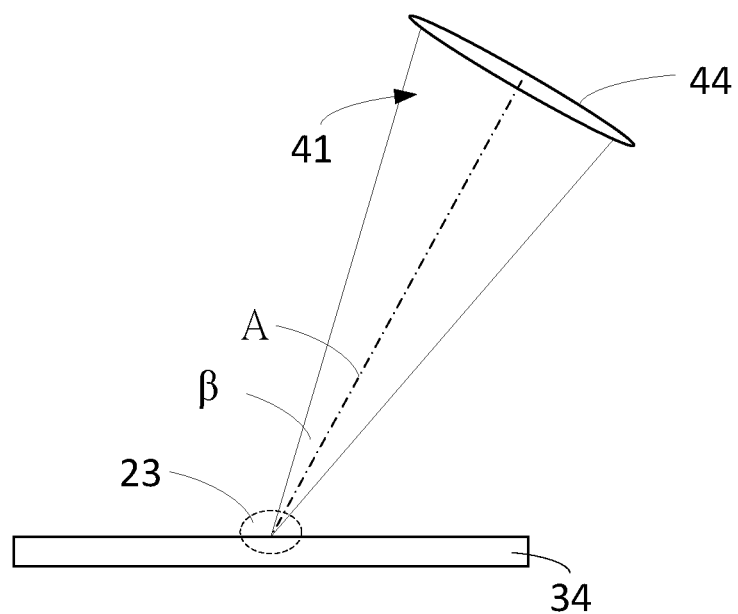
FIG. 11 is a zoom-in diagram illustrating a focused vacuum ultraviolet light according to the present invention.

FIG. 11 is a zoom-in diagram illustrating a focused vacuum ultraviolet light according to the present invention. Shown in FIG. 11, the focused vacuum ultraviolent light 41, which is from the light focusing member 44 and is optionally reflected by the reflective member 45, is convergent toward the observation position 23. The convergence of the focused vacuum ultraviolent light 41 may be illustrated with an optical axis A and a convergence semi-angle β. The light beam changes traveling direction with passing through the light focusing member 44, approaches the optical axis A from the outside and reduces its own beam diameter. There are features of the convergence for the light beam (the focused vacuum ultraviolent light 41): the cross-sectional area that the focused vacuum ultraviolent light 41 irradiates onto the sample 34 is smaller than that of the focused vacuum ultraviolent light 41 just entering into the light focusing member 44; and the convergence semi-angle β is between 0 and 90 degrees and exists in front of a focus point which may be in the interior or on the surface of the sample 34.

The embodiments have been described above to enable the persons skilled in the art to understand, make, and use the present invention. However, these embodiments are only to exemplify the present invention but not to limit the scope of the present invention. Therefore, any modification or variation according to the spirit of the present invention is to be also included by the scope of the present invention.

What is claimed is:

1. A detection and charge neutralization device, comprising:
   a vacuum chamber;
   an electrical optical system, outputting a charged particle beam to an observation position of the vacuum chamber; and
   a charge neutralization member, providing a focused vacuum ultraviolet light to the observation position, wherein the charge neutralization member includes a light output surface emitting a vacuum ultraviolet light and a light focusing member focusing the vacuum ultraviolet light to form the focused vacuum ultraviolet light, and wherein the light focusing member includes a convex lens disposed near the light output surface or attached to the light output surface to receive and focus the vacuum ultraviolet light.

2. The detection and charge neutralization device according to claim 1, wherein a wavelength of the vacuum ultraviolet light ranges from 10 nm to 300 nm or ranges from 100 nm to 200 nm.

3. The detection and charge neutralization device according to claim 1, wherein the light focusing member further includes a planar reflector receiving and reflecting the vacuum ultraviolet light focused by the convex lens to form the focused vacuum ultraviolet light.

4. The detection and charge neutralization device according to claim 3, further comprising an adjustment member adjusting a position, an orientation, or a combination thereof of the planar reflector.

5. A detection and charge neutralization device, comprising:
   a vacuum chamber;
   an electrical optical system, outputting a charged particle beam to an observation position of the vacuum chamber; and
      a charge neutralization member, providing a focused vacuum ultraviolet light to the observation position, wherein the charge neutralization member includes a light output surface emitting a vacuum ultraviolet light and a light focusing member focusing the vacuum ultraviolet light to form the focused vacuum ultraviolet light, and wherein the light focusing member includes a concave mirror disposed near the light output surface to receive, focus and reflect the vacuum ultraviolet light.

6. The detection and charge neutralization device according to claim 5, wherein the charge neutralization member further includes a collimator disposed between the light output surface and the concave mirror.

7. The detection and charge neutralization device according to claim 5, wherein the concave mirror is rotatable.

8. A detection and charge neutralization device, comprising:
   a vacuum chamber;
   an electrical optical system, outputting a charged particle beam to an observation position of the vacuum chamber; and
      a charge neutralization member, providing a focused vacuum ultraviolet light to the observation position, wherein the charge neutralization member includes a light output surface emitting a vacuum ultraviolet light and a light focusing member focusing the vacuum ultraviolet light to form the focused vacuum ultraviolet light, and wherein the light focusing member includes a collimator and a focusing lens both disposed inside a tube, and wherein the collimator is arranged near the light output surface or attached to the light output surface.

9. The detection and charge neutralization device according to claim 8, wherein the light focusing member includes an optical fiber, or a light guide, or a light focusing lens integrated with an optical fiber, or a light focusing lens integrated with a light guide.

10. The detection and charge neutralization device according to claim 8, wherein the focused vacuum ultraviolet light is projected to the observation position in a direction not parallel to a direction of the charged particle beam.

11. The detection and charge neutralization device according to claim 8, wherein a radius of a projection area of the focused vacuum ultraviolet light on the observation position is smaller than 10 mm or smaller than 5 mm, or ranges from 0.005 mm to 50 mm.

12. The detection and charge neutralization device according to claim 9, further comprising an additional charge neutralization member or a plurality of additional charge neutralization members.

13. The detection and charge neutralization device according to claim 9, wherein a radius of a projection area of the focused vacuum ultraviolet light on the observation position is smaller than 10 mm or smaller than 5 mm, or ranges from 0.0005 mm to 50 mm.

* * * * *